(12) United States Patent
Kanda

(10) Patent No.: US 9,911,863 B2
(45) Date of Patent: Mar. 6, 2018

(54) THIN FILM TRANSISTOR AND MANUFACTURING METHOD OF THIN FILM TRANSISTOR

(71) Applicant: Japan Display Inc., Minato-ku (JP)

(72) Inventor: Noriyoshi Kanda, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/427,442

(22) Filed: Feb. 8, 2017

(65) Prior Publication Data
US 2017/0229582 A1 Aug. 10, 2017

(30) Foreign Application Priority Data

Feb. 8, 2016 (JP) ................................ 2016-022043

(51) Int. Cl.
| | |
|---|---|
| *H01L 29/786* | (2006.01) |
| *H01L 21/02* | (2006.01) |
| *H01L 21/441* | (2006.01) |
| *H01L 21/4763* | (2006.01) |
| *H01L 29/24* | (2006.01) |
| *H01L 29/45* | (2006.01) |
| *H01L 29/49* | (2006.01) |
| *H01L 29/66* | (2006.01) |

(52) U.S. Cl.
CPC .... *H01L 29/7869* (2013.01); *H01L 21/02565* (2013.01); *H01L 21/441* (2013.01); *H01L 21/47635* (2013.01); *H01L 29/24* (2013.01); *H01L 29/45* (2013.01); *H01L 29/4908* (2013.01); *H01L 29/66969* (2013.01)

(58) Field of Classification Search
CPC ............ H01L 29/4908; H01L 29/7869; H01L 29/78693
See application file for complete search history.

(56) References Cited

U.S. PATENT DOCUMENTS

| | | | | |
|---|---|---|---|---|
| 8,129,719 | B2 * | 3/2012 | Yamazaki | ........... H01L 29/4908 257/43 |
| 2010/0320457 | A1 * | 12/2010 | Matsubara | ................ C23F 1/02 257/43 |

FOREIGN PATENT DOCUMENTS

JP 2010-186861 8/2010

* cited by examiner

*Primary Examiner* — Jose R Diaz

(74) *Attorney, Agent, or Firm* — Oblon, McClelland, Maier & Neustadt, L.L.P.

(57) ABSTRACT

According to one embodiment, a manufacturing method of thin film transistor includes forming an oxide semiconductor layer on a first insulating film, forming a first conductive layer formed of molybdenum or a molybdenum alloy on the oxide semiconductor layer, forming a second conductive layer on the first conductive layer, forming a resist mask on the second conductive layer, and forming a first conductive portion and a second conductive portion by performing dry etching of the second conductive layer using the resist mask.

4 Claims, 5 Drawing Sheets

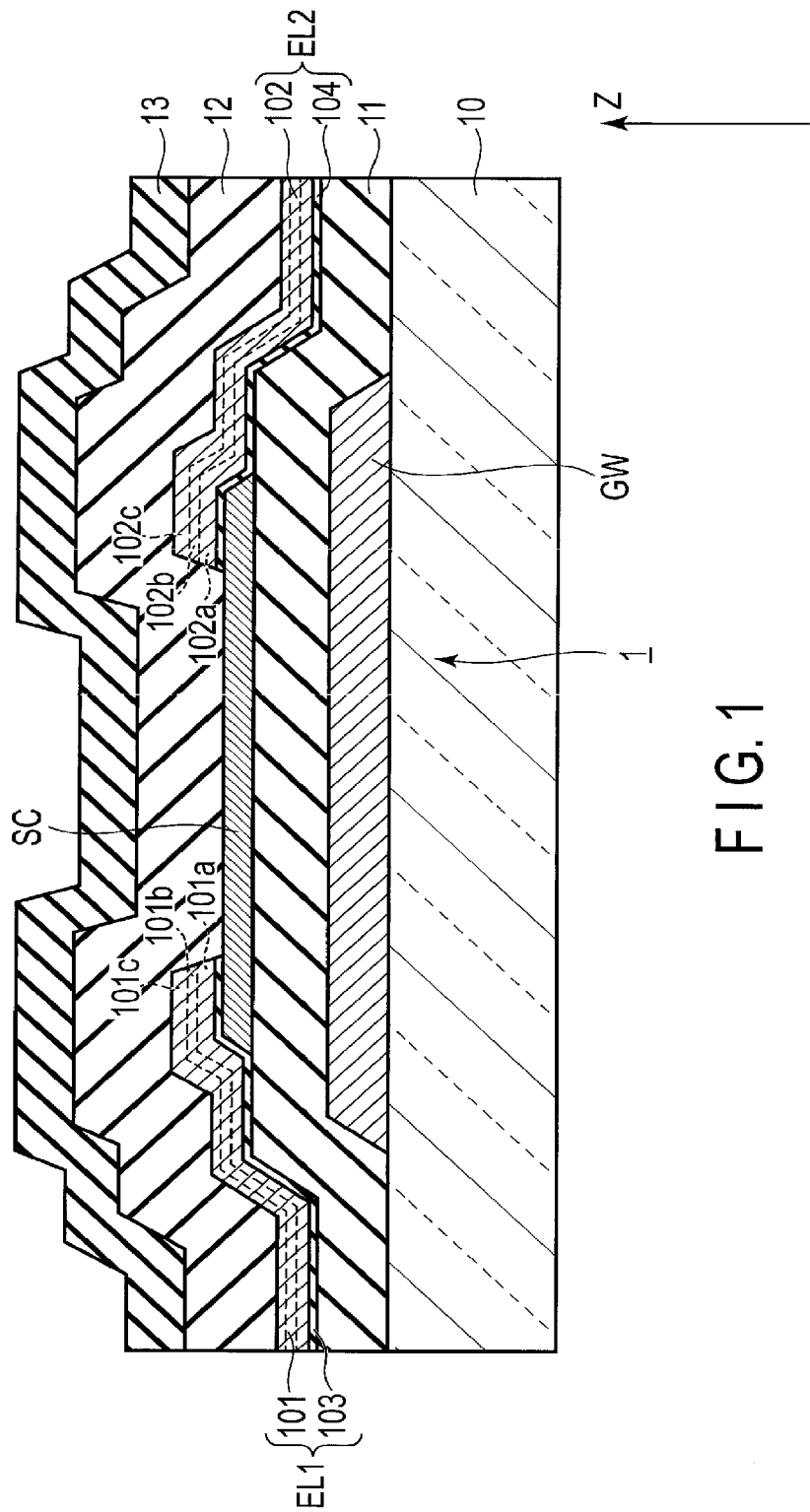
F I G. 1

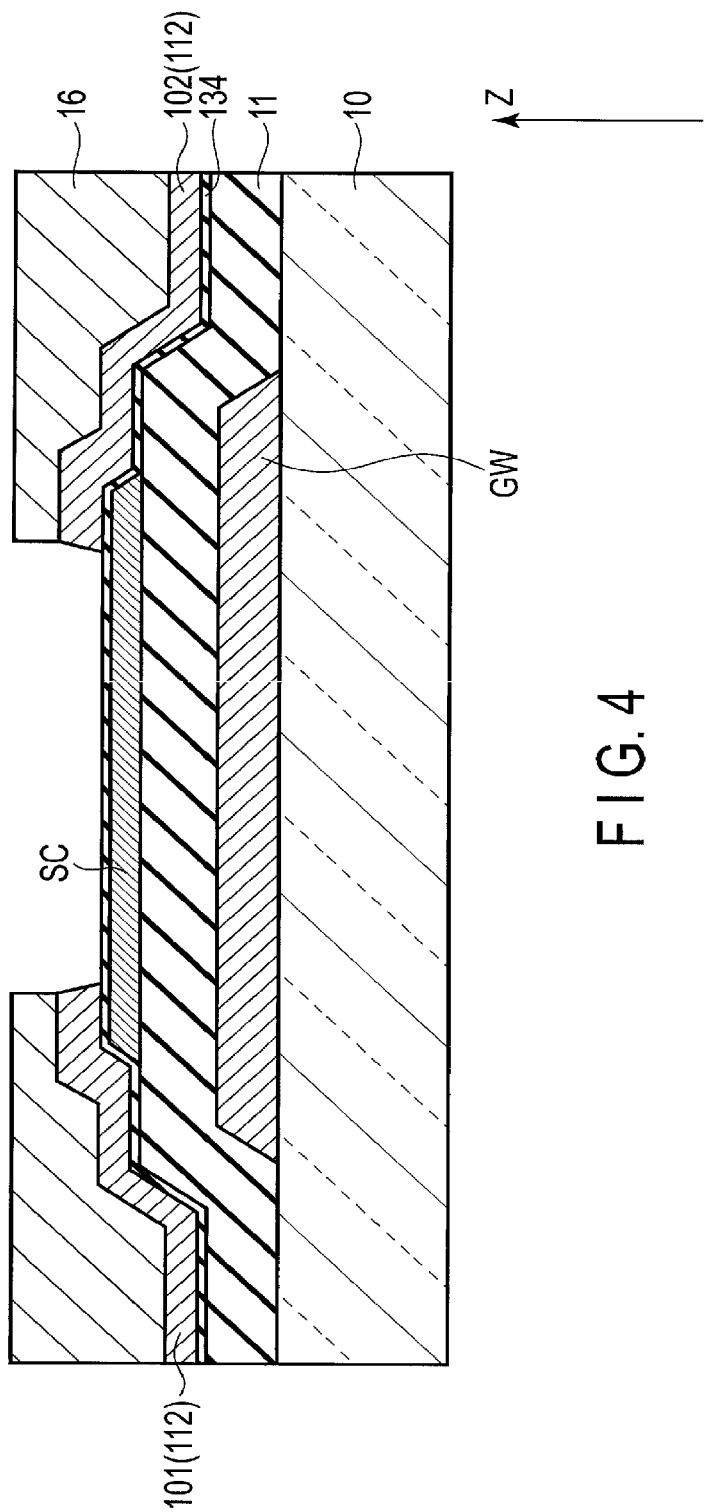
F I G. 4

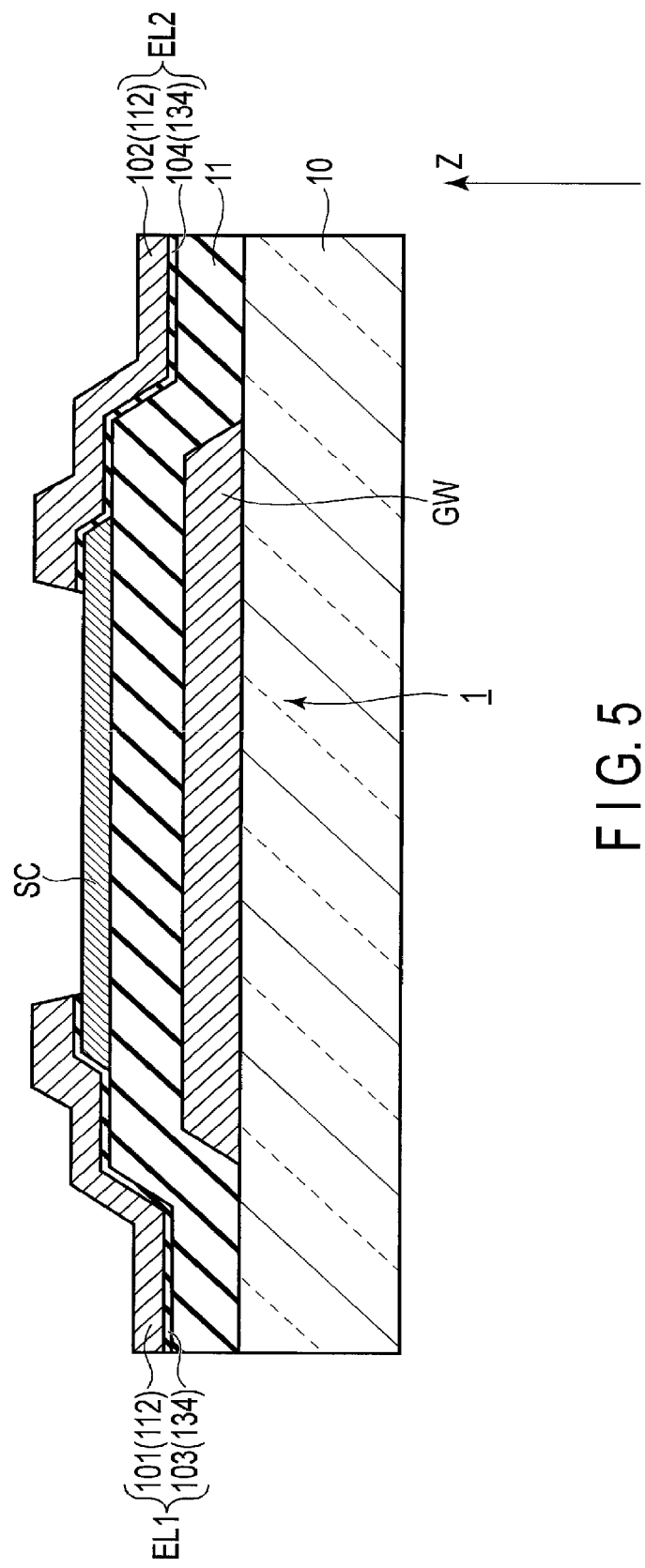
F I G. 5

THIN FILM TRANSISTOR AND MANUFACTURING METHOD OF THIN FILM TRANSISTOR

CROSS-REFERENCE TO RELATED APPLICATIONS

This application is based upon and claims the benefit of priority from Japanese Patent Application No. 2016-022043, filed Feb. 8, 2016, the entire contents of which are incorporated herein by reference.

FIELD

Embodiments described herein relate generally to a thin film transistor and a manufacturing method of a thin film transistor.

BACKGROUND

As thin film transistors used in display devices such as liquid crystal displays and various control circuits, there are thin film transistors in which an oxide semiconductor is used as a semiconductor layer.

Such thin film transistors include, for example, an oxide semiconductor layer, source electrode, and drain electrode above an insulating substrate. In an etching process to form the source electrode and the drain electrode, the oxide semiconductor layer may be damaged and it may cause a shift in a threshold value voltage and a deterioration in a TFT performance. Therefore, there is a proposed technique to maintain a thin conductive layer between the source electrode and the drain electrode while performing etching of the source electrode and the drain electrode and to cause a chemical action in the semiconductor layer into a semiconductor or an insulating material.

BRIEF DESCRIPTION OF THE DRAWINGS

FIG. 1 is a cross-sectional view of the structure of a thin film transistor of an embodiment.

FIG. 4 is a cross-sectional view showing a manufacturing method of the thin film transistor after the process of FIG. 3.

FIG. 5 is a cross-sectional view showing a manufacturing method of the thin film transistor after the process of FIG. 4.

DETAILED DESCRIPTION

Figure 2:
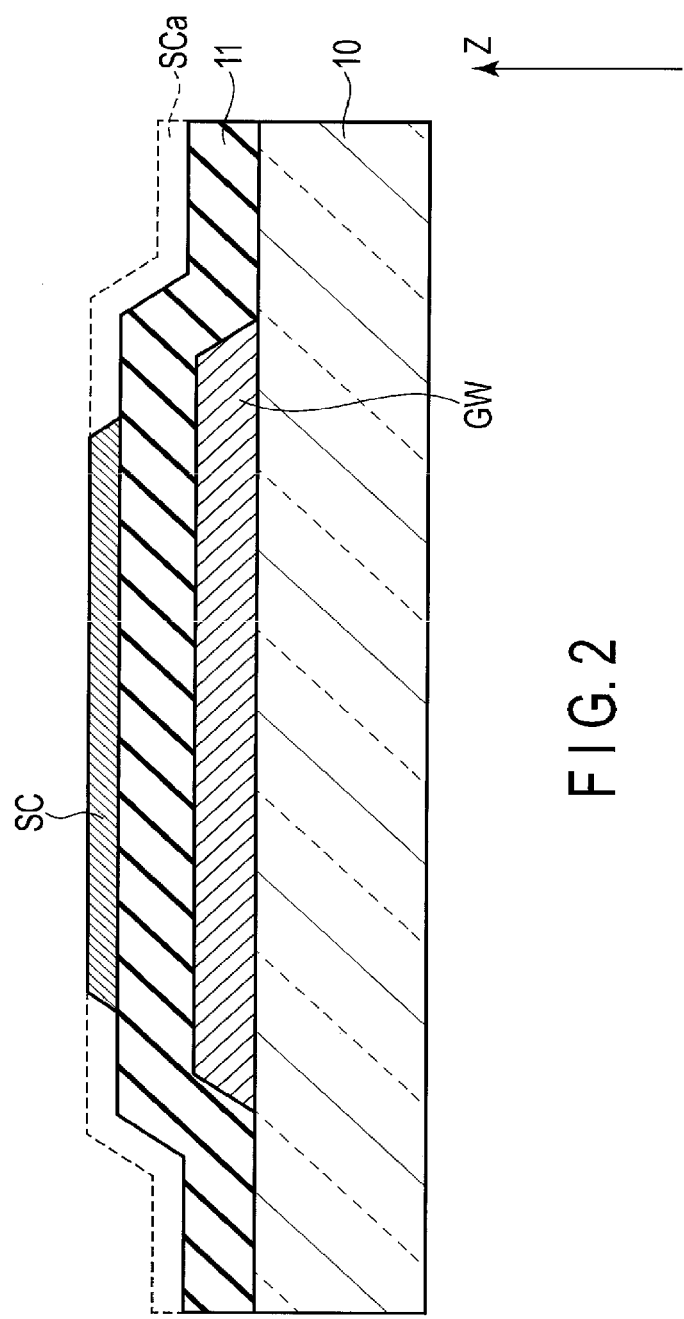
FIG. 2 is a cross-sectional view of the structure of the thin film transistor of the embodiment.

In general, according to one embodiment, provided is a manufacturing method of thin film transistor including: forming an oxide semiconductor layer on a first insulating film; forming a first conductive layer formed of molybdenum or a molybdenum alloy on the oxide semiconductor layer; forming a second conductive layer on the first conductive layer; forming a resist mask on the second conductive layer; and forming a first conductive portion and a second conductive portion by performing dry etching of the second conductive layer using the resist mask.

According to one embodiment, provided is a thin film transistor including: an oxide semiconductor layer disposed on a first insulating film; a first conductive portion and a second conductive portion disposed above the first insulating film and the oxide semiconductor layer; a third conductive portion between the first conductive portion and the oxide semiconductor layer, the third conductive portion contacting the first conductive portion and the oxide semiconductor layer and forms a first electrode with the first conductive portion; and a fourth conductive portion between the second conductive portion and the oxide semiconductor layer, the fourth conductive portion contacting the second conductive portion and the oxide semiconductor layer and forms a second electrode with the second conductive portion, wherein the first electrode and the second electrode are positioned with a gap therebetween, and the third conductive portion and the fourth conductive portion are formed of molybdenum or a molybdenum alloy.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless necessary.

FIG. 1 is a cross-sectional view of the structure of a thin film transistor 1 of an embodiment. In the present embodiment, a direction of a third direction Z will be defined as up or above and an opposite direction of the third direction Z will be defined as down or below. Furthermore, phrases such as "a second member above a first member" and "a second member below a first member" may refer to either a case where the second member contacts the first member or a case where the second member is apart from the first member. In the latter case, a third member may be interposed between the first and second members. On the other hand, phrases such as "a second member on a first member" and "a second member right under a first member" refer to a case where the second member contacts the first member.

An insulating substrate 10 is formed of an insulating material such as glass. The thin film transistor 1 is formed above the insulating substrate 10. In the example depicted, the thin film transistor 1 includes, for example, a gate electrode GW, oxide semiconductor layer SC, first electrode EL1, and second electrode EL2. The thin film transistor 1 of the present embodiment is a thin film transistor of bottom gate type.

The gate electrode GW is formed above the insulating substrate 10. In the present embodiment, the gate electrode GW is formed on the insulating substrate 10. The gate electrode GW is formed of a metal material such as copper (Cu), aluminum (Al), titanium (Ti), molybdenum (Mo), or tungsten (W), or an alloy containing at least one of the aforementioned elements. Note that, unlike the present embodiment, an insulating film using a silicon oxide (SiO) as its underlayer may be formed between the insulating substrate 10 and the gate electrode GW.

A first insulating film 11 is formed on the gate electrode GW and the insulating substrate 10 to cover the gate electrode GW and the insulating substrate 10. The first insulating film 11 is formed of, for example, a silicon oxide layer containing a silicon oxide. Note that the first insulating film 11 may have a layered structure including, for example, a silicon oxide layer and a silicon nitride layer containing a silicon nitride (SiN). In that case, the silicon oxide layer is preferably the uppermost layer of the first insulating film 11.

The oxide semiconductor layer SC is disposed on the first insulating film 11. The oxide semiconductor layer SC is opposed to the gate electrode GW in the third direction Z. The oxide semiconductor layer SC is formed of, for example, an oxide containing at least one of indium (In), gallium (Ga), zinc (Zn), and tin (Sn). As exemplary elements used for the oxide semiconductor layer SC, there are, for example, indium gallium zinc oxide (IGZO), indium gallium oxide (IGO), indium zinc oxide (IZO), zinc tin oxide (Zn-SnO), and zinc oxide (ZnO).

The first electrode EL1 and the second electrode EL2 are disposed on the first insulating film 11 and are partly disposed on the oxide semiconductor layer SC. The first electrode EL1 and the second electrode EL2 are disposed at intervals above the oxide semiconductor layer SC. If the first electrode EL1 functions as a source electrode, the second electrode EL2 functions as a drain electrode. Alternatively, if the first electrode EL1 functions as a drain electrode, the second electrode EL2 functions as a source electrode. The first electrode EL1 includes a first conductive portion 101 and a third conductive portion 103. The second electrode EL2 includes a second conductive portion 102 and a fourth conductive portion 104.

The first conductive portion 101 and the second conductive portion 102 are disposed above the first insulating film 11 and the oxide semiconductor layer SC. As will be described later, the first conductive portion 101 and the second conductive portion 102 are formed of the same material through the same manufacturing process. For example, the first conductive portion 101 and the second conductive portion 102 may be formed as a titanium layer and an aluminum layer, respectively, layered one another.

The third conductive portion 103 and the fourth conductive portion 104 are disposed on the first insulating film 11 and are partly disposed on the oxide semiconductor layer SC. The third conductive portion 103 is disposed between the first conductive portion 101 and the oxide semiconductor layer SC and contacts the first conductive portion 101 and the oxide semiconductor layer SC. The fourth conductive portion 104 is disposed between the second conductive portion 102 and the oxide semiconductor layer SC and contacts the second conductive portion 102 and the oxide semiconductor layer SC. As will be described later, the third conductive portion 103 and the fourth conductive portion 104 are formed of the same material through the same manufacturing process, and are formed of, for example, a molybdenum material. In the present embodiment, the third conductive portion 103 and the fourth conductive portion 104 are formed of molybdenum tungsten (MoW).

Note that, each of the first conductive portion 101 and the second conductive portion 102 I a layered structure including a first layer disposed on the third conductive portion 103 and the fourth conductive portion 104 and formed of titanium (Ti), second layer disposed on the first layer and formed of aluminum (Al) or an aluminum alloy, and third layer disposed on the second layer and formed of titanium (Ti).

A second insulating film 12 is formed on the oxide semiconductor layer SC, first electrode EL1, and second electrode EL2 and covers the oxide semiconductor layer SC, first electrode EL1, and second electrode EL2. The second insulating film 12 is formed of an oxide insulating material such as a silicon oxide. A third insulating film 13 is formed on the second insulating film 12 and covers the second insulating film 12. The third insulating film 13 is formed of, for example, a silicon nitride.

Now, a manufacturing method of the thin film transistor 1 of the present embodiment will be explained with reference to FIGS. 2 to 5.

FIG. 2 is a cross-sectional view showing a manufacturing method of the thin film transistor 1 of the above embodiment.

Initially, a gate electrode GW is formed on an insulating substrate 10 through a generally-known method. For example, the gate electrode GW is formed by forming a metal film on the insulating substrate 10 and performing a patterning on the metal film. Here, the gate electrode GW is approximately 300 nm in thickness in the third direction Z. Then, on the insulating substrate 10 with the gate electrode GW, a first insulating film 11 formed of silicon oxide is formed through, for example, plasma chemical vapor deposition (CVD). Then, on the first insulating film 11, an oxide semiconductor layer SCa formed of an oxide containing at least one of indium (In), gallium (Ga), zinc (Zn), and tin (Sn) through, for example, sputtering. Then, on the oxide semiconductor layer SCa, a resist mask is formed, and wet etching of the oxide semiconductor layer SCa is performed with, for example, oxalic acid using the resist mask. Thereby, on the first insulating film 11, an oxide semiconductor layer SC of island-shape is formed. Then, the resist mask on the oxide semiconductor layer SC is peeled off. Here, the oxide semiconductor layer SC is approximately 75 nm in thickness in the third direction Z.

Figure 3:
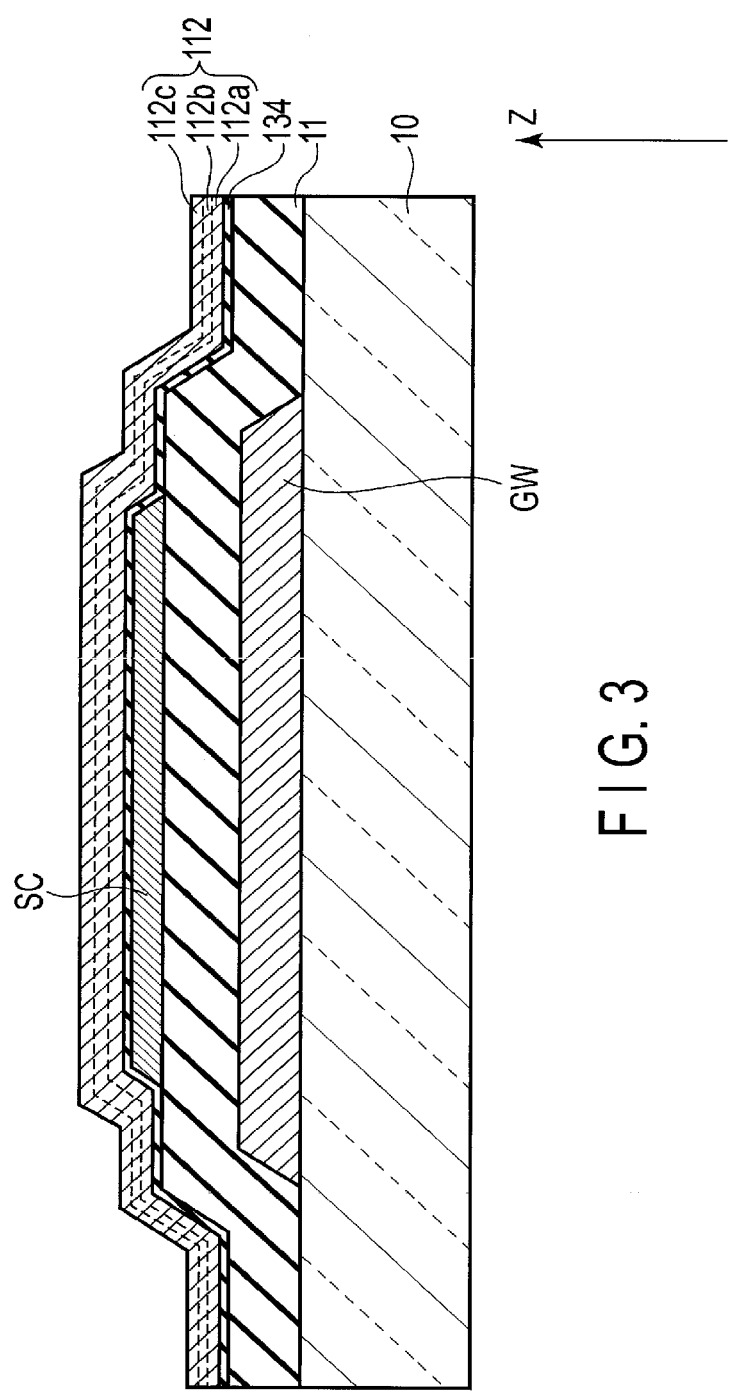
FIG. 3 is a cross-sectional view showing a manufacturing method of the thin film transistor after the process of FIG. 2.

FIG. 3 is a cross-sectional view showing a manufacturing method of the thin film transistor 1 after the process of FIG. 2.

Then, as shown in FIG. 3, a first conductive layer 134 formed of a molybdenum material is formed on the insulating substrate 10 and the oxide semiconductor layer SC using, for example, sputtering. The molybdenum material may be, for example, molybdenum and a molybdenum alloy. In the present embodiment, the first conductive layer 134 is formed of molybdenum tungsten (MoW). Then, a second conductive layer 112 is formed on the first conductive layer 134 through, for example, sputtering. In the example depicted, the second conductive layer 112 includes a first layer 112a, second layer 112b, and third layer 112c, and is formed as a layered structure of the first layer 112a, second layer 112b, and third layer 112c. The first layer 112a is formed on the first conductive layer 134. The second layer 112b is formed on the first layer 112a. The third layer 112c is formed on the second layer 112b. The first layer 112a and the third layer 112c are formed of titanium and the second layer 112b is formed of aluminum or an aluminum alloy. For example, the second conductive layer 112 is approximately 400 nm in thickness in the third direction Z. Here, the first layer 112a is approximately 50 nm, second layer 112b is approximately 300 nm, and third layer is approximately 50 nm.

FIG. 4 is a cross-sectional view showing a manufacturing method of the thin film transistor 1 after the process of FIG. 3.

As shown in FIG. 4, a resist mask 16 is formed on the second conductive layer 112 through a generally-known method. For example, the resist mask 16 is formed by forming a resist film on the second conductive layer 112 and performing a patterning on the resist film through photoetching. The resist mask 16 is formed in an area in which a first electrode EL1 and a second electrode EL2 are to be formed. Then, the second conductive layer 112 is etched by dry etching using the resist mask 16. Therefore, a first conductive portion 101 and a second conductive portion 102 are formed from the second conductive layer 112. Here, a gas used in dry etching is, for example, a chlorine gas. A chlorine gas is an etching gas containing chlorine. Furthermore, in the present embodiment, an etching rate of the first conductive layer 134 is different from that of the second conductive layer 112, and thus, the second conductive layer 112 is etched in dry etching while the first conductive layer 134 is not etched. That is, when the second conductive layer 112 is etched, the oxide semiconductor layer SC is covered by the first conductive layer 134, and the dry etching gas does not reach the oxide semiconductor layer SC. Therefore, the first conductive layer 134 keeps the oxide semiconductor layer SC away from an effect of dry etching.

FIG. 5 is a cross-sectional view showing a manufacturing method of the thin film transistor 1 after the process of FIG. 4.

As shown in FIG. 5, the first conductive layer 134 is etched by wet etching using a first conductive portion 101, second conductive portion 102, and resist mask 16 as a mask. Therefore, a third conductive portion 103 and a fourth conductive portion 104 are formed from the first conductive layer 134. The third conductive portion 103 and the fourth conductive portion 104 are approximately 20 nm in thickness in the third direction Z. Here, in wet etching of the first conductive layer 134, a mixed acid such as phosphoric-nitric-acetic acid. The first conductive portion 101 and the third conductive portion 103 overlap with each other to form a first electrode EL1. The second conductive portion 102 and the fourth conductive portion 104 overlap with each other to form a second electrode EL2.

Then, the resist mask 16 is removed by a resist peeling solution. Then, as shown in FIG. 1, a second insulating film 12 formed of a silicon oxide is formed through, for example, plasma CVD on the oxide semiconductor layer SC, first electrode EL1, and second electrode EL2.

Then, as shown in FIG. 1, a third insulating film 13 as a protection film is formed on the second insulating film 12 by depositing, for example, a silicon nitride through, for example, CVD.

In the present embodiment, when forming the thin film transistor 1, the first conductive layer 134 is formed on the oxide semiconductor layer SC and the second conductive layer 112 is formed on the first conductive layer 134. The etching rate of the first conductive layer 134 is different from that of the second conductive layer 112. Therefore, in the dry etching process of the second conductive layer 112, the first conductive layer 134 is almost intact and the dry etching gas does not reach the oxide semiconductor layer SC. Therefore, a damage to and a reduction in the oxide semiconductor layer SC by the dry etching gas can be suppressed. Consequently, unevenness in the film thickness of the oxide semiconductor layer SC or the like can be suppressed, and unstableness in a threshold voltage caused by the unevenness in the film thickness of the oxide semiconductor layer SC can be suppressed, too.

Furthermore, after the dry etching process of the second conductive layer 112, the first conductive layer 134 on the oxide semiconductor layer SC is wet-etched using the resist mask 16, first conductive portion 101, and second conductive portion 102 as a mask. Therein, the oxide semiconductor layer 134 is almost intact by wet etching. Therefore, an amount of reduction in the oxide semiconductor layer SC in the present embodiment is greatly suppressed as compared to an amount of reduction in an oxide semiconductor layer in which the first conductive layer 134 is not formed.

As explained above, the present embodiment can present a thin film transistor which can suppress unevenness in electric characteristics and a manufacturing method of such a thin film transistor.

Note that, in the above manufacturing method of the thin film transistor 1, the wet etching process of the first conductive layer 134 and the peeling process of the resist mask may be switched. If the peeling process of the resist mask 16 is performed first, a reduction in the oxide semiconductor layer SC in the resist peeling process can be suppressed because the oxide semiconductor layer SC is covered with the first conductive layer 134. However, as in the above embodiment, the wet etching process of the first conductive layer 134 may be performed first. When a damage to the oxide semiconductor layer SC by the dry etching process increases, a reduction in the oxide semiconductor layer SC during the resist peeling process increases. In the present embodiment, a damage to the oxide semiconductor layer SC by the dry etching process is suppressed, and thus, a damage to the oxide semiconductor layer SC in the resist peeling process can be suppressed significantly as compared to a case where the oxide semiconductor layer SC is exposed to a dry etching gas.

Note that the thin film transistor 1 of the present embodiment is applicable to various flat-panel display devices such as liquid crystal display devices, organic electroluminescent display devices, self-luminous display devices, and electronic paper display devices with electrophoretic elements and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of thin film transistor, the method comprising:

forming an oxide semiconductor layer on a first insulating film;

forming a first conductive layer formed of molybdenum or a molybdenum alloy on the oxide semiconductor layer;

forming a second conductive layer on the first conductive layer;

forming a resist mask on the second conductive layer;

forming a first conductive portion and a second conductive portion by performing dry etching of the second conductive layer using the resist mask; and performing wet etching of the first conductive layer using the first conductive portion and the second conductive portion as a mask to form a third conductive portion which overlaps the first conductive portion and forms a first electrode with the first conductive portion and a fourth conductive portion which overlaps the second conductive portion and forms a second electrode with the second conductive portion.

2. The manufacturing method of thin film transistor of claim 1, wherein the oxide semiconductor layer is formed using an oxide containing at least one of indium (In), gallium (Ga), zinc (Zn), and tin (Sn).

3. The manufacturing method of thin film transistor of claim 1, wherein the first conductive layer is formed using molybdenum tungsten (MoW).

4. The manufacturing method of thin film transistor of claim 1, the method further comprising, during the formation of the second conductive layer:
   forming a first layer on the first conductive layer using titanium (Ti);
   forming a second layer on the first layer using aluminum (Al) or an aluminum alloy;
   forming a third layer on the second layer using titanium (Ti); and
   forming the second conductive layer as a layered structure of the first, second, and third layers.

* * * * *